US010683586B2

(12) United States Patent
Ozyilmaz et al.

(10) Patent No.: US 10,683,586 B2
(45) Date of Patent: Jun. 16, 2020

(54) METHOD OF PULSED LASER-BASED LARGE AREA GRAPHENE SYNTHESIS ON METALLIC AND CRYSTALLINE SUBSTRATES

(71) Applicant: National University of Singapore, Singapore (SG)

(72) Inventors: Barbaros Ozyilmaz, Singapore (SG); Andreas Volker Stier, Singapore (SG); Chee Tat Toh, Singapore (SG); Antonio Helio Castro Neto, Singapore (SG)

(73) Assignee: National University of Singapore, Singapore (SG)

( * ) Notice: Subject to any disclaimer, the term of this patent is extended or adjusted under 35 U.S.C. 154(b) by 312 days.

(21) Appl. No.: 15/116,364

(22) PCT Filed: Feb. 4, 2015

(86) PCT No.: PCT/SG2015/000029
§ 371 (c)(1),
(2) Date: Aug. 3, 2016

(87) PCT Pub. No.: WO2015/119572
PCT Pub. Date: Aug. 13, 2015

(65) Prior Publication Data
US 2016/0340797 A1    Nov. 24, 2016

Related U.S. Application Data

(60) Provisional application No. 61/935,535, filed on Feb. 4, 2014, provisional application No. 62/020,527, filed on Jul. 3, 2014.

(51) Int. Cl.
*H01L 29/16* (2006.01)
*C30B 25/10* (2006.01)
(Continued)

(52) U.S. Cl.
CPC .......... *C30B 25/105* (2013.01); *C01B 32/186* (2017.08); *C01B 32/188* (2017.08);
(Continued)

(58) Field of Classification Search
CPC . H01L 29/1606; C23C 16/483; C30B 25/105; C30B 29/02
See application file for complete search history.

(56) References Cited

U.S. PATENT DOCUMENTS 4,986,214 A * 1/1991 Zumoto ................ C23C 16/483
118/722
5,731,046 A  3/1998 Mistry
(Continued)

FOREIGN PATENT DOCUMENTS

CN    103288073    9/2013
JP    2006035174 A  2/2006
(Continued)

OTHER PUBLICATIONS

European Patent Office, English computer translation of KR20120045100 (Year: 2018).*
(Continued)

*Primary Examiner* — Matthew J Song
(74) *Attorney, Agent, or Firm* — Hamilton, Brook, Smith & Reynolds, P.C.

(57) ABSTRACT

A method of making graphene includes providing a seed gas in the presence of a metallic substrate, providing a pulsed, ultraviolet laser beam, and moving the substrate or the laser beam relative to the other, thereby advancing a graphene crystallization front and forming an ordered graphene structure. In some instances, the substrate can have a surface with two-fold atomic symmetry. A method of recrystallizing graphene includes providing a pulsed, ultraviolet laser beam to a polycrystalline graphene sheet.

10 Claims, 5 Drawing Sheets

(51) Int. Cl.
| | |
|---|---|
| C01B 32/188 | (2017.01) |
| C01B 32/186 | (2017.01) |
| C23C 16/48 | (2006.01) |
| C30B 1/02 | (2006.01) |
| C30B 25/18 | (2006.01) |
| C30B 29/02 | (2006.01) |
| B82Y 40/00 | (2011.01) |

(52) U.S. Cl.
 CPC .............. *C23C 16/483* (2013.01); *C30B 1/02* (2013.01); *C30B 25/18* (2013.01); *C30B 29/02* (2013.01); *H01L 29/1606* (2013.01); *B82Y 40/00* (2013.01)

(56) References Cited

U.S. PATENT DOCUMENTS

| | | | | |
|---|---|---|---|---|
| 6,219,469 | B1* | 4/2001 | Minakata | G02F 1/035 |
| | | | | 359/245 |
| 7,850,863 | B2 | 12/2010 | Zenasni | |
| 8,026,165 | B2 | 9/2011 | Zenasni | |
| 8,133,548 | B2 | 3/2012 | Zenasni | |
| 8,231,797 | B2 | 7/2012 | Jousseaume et al. | |
| 8,367,118 | B2 | 2/2013 | Curatolo et al. | |
| 8,617,669 | B1 | 12/2013 | Quick et al. | |
| 8,617,965 | B1 | 12/2013 | Quick et al. | |
| 8,623,466 | B2 | 1/2014 | Zenasni | |
| 8,637,118 | B2 | 1/2014 | Zenasni | |
| 8,647,669 | B2 | 2/2014 | Soscia et al. | |
| 8,999,440 | B2 | 4/2015 | Zenasni et al. | |
| 9,159,550 | B2 | 10/2015 | Zenasni | |
| 2009/0322319 | A1 | 12/2009 | Kreupl | |
| 2010/0012032 | A1 | 1/2010 | Chen | |
| 2010/0247801 | A1 | 9/2010 | Zenasni | |
| 2011/0030879 | A1 | 2/2011 | Veerasamy | |
| 2011/0151278 | A1 | 6/2011 | Gurney et al. | |
| 2011/0195207 | A1 | 8/2011 | Hong et al. | |
| 2011/0244662 | A1* | 10/2011 | Lee | C23C 16/0272 |
| | | | | 438/478 |
| 2012/0021249 | A1 | 1/2012 | Shin et al. | |
| 2012/0040145 | A1 | 2/2012 | Zenasni et al. | |
| 2012/0048195 | A1 | 3/2012 | Lin | |
| 2012/0068161 | A1* | 3/2012 | Lee | B82Y 30/00 |
| | | | | 257/29 |
| 2012/0088039 | A1 | 4/2012 | Yu et al. | |
| 2012/0132353 | A1 | 5/2012 | Hauck | |
| 2012/0156424 | A1* | 6/2012 | Chen | B82Y 30/00 |
| | | | | 428/119 |
| 2013/0127023 | A1 | 5/2013 | Zenasni | |
| 2013/0202813 | A1 | 8/2013 | Chueh et al. | |
| 2014/0239461 | A1* | 8/2014 | Delabie | H01L 21/02181 |
| | | | | 257/632 |
| 2016/0148633 | A1 | 5/2016 | Hasegawa | |
| 2016/0258081 | A1 | 9/2016 | Ozyilmaz et al. | |
| 2016/0340783 | A1 | 11/2016 | Lu | |

FOREIGN PATENT DOCUMENTS

| | | | | |
|---|---|---|---|---|
| JP | WO2011021715 A1 | 1/2013 | | |
| JP | 2013513544 A | 4/2013 | | |
| KR | 20120045100 A * | 5/2012 | ............ | C01B 31/02 |
| KR | 20120045100 A | 5/2012 | | |
| WO | 2011021715 A1 | 2/2011 | | |
| WO | WO 2012/044284 A1 | 4/2012 | | |
| WO | 2013138216 A1 | 9/2013 | | |
| WO | 2014027529 A1 | 2/2014 | | |
| WO | WO 2015/072927 A1 | 5/2015 | | |
| WO | WO 2015/119572 A1 | 8/2015 | | |

OTHER PUBLICATIONS

Choi, I., et al., "Laser-Induced Solid-Phase Doped Graphene", 8(8): 7671-7677 (2014).

Dhar, S., et al., "A new route to graphene layers by selective laser ablation", AID Advances, 1, 022109 (2011).
International Preliminary Report on Patentability dated Aug. 9, 2016 for International Application No. PCT/SG2014/000029 entitled "Method of Pulsed Laser-Based Large Area Graphene Synthesis on Metallic and Crystalline Substrates".
International Preliminary Report on Patentability dated May 17, 2016 for International Application No. PCT/SG2014/000540 entitled "Ordered Growth of Large Crystal Graphene by Laser-Based Localized Heating for High Throughput Production".
International Search Report and Written Opinion of the International Searching Authority dated Feb. 5, 2015 for International Application No. PCT/SG2014/000540 entitled "Ordered Growth of Large Crystal Graphene by Laser-Based Localized Heating for High Throughput Production".
International Search Report and Written Opinion of the International Searching Authority dated Apr. 16, 2015 for International Application No. PCT/SG2014/000029 entitled "Method of Pulsed Laser-Based Large Area Graphene Synthesis on Metallic and Crystalline Substrates".
Kumar, P., "Laser flash synthesis of graphene and its inorganic analogues: An innovative breakthrough with immense promise," RCS Advances, 2013, 3, 11987-12002.
Lee, J-H., et al., "Wafer-Scale Growth of Single-Crystal Monolayer Graphene on Reusable Hydrogen-Terminated Germanium", Science, 344: 286-289 (Apr. 18, 2014).
Li, X., et al. "Large-area synthesis of high-quality and uniform graphene films on copper foils," Science 324, 1312-14 (2009).
Park, J.B, et al., "Fast growth graphene patterns by laser direct writing," Applied Physics Letters 98, 123109-1-3 (2011).
Park, J.B. et al., "Transparent interconnections formed by rapid single-step fabrication of graphene patterns," Applied Physics Letters 99, 053103-1-3 (2011).
Wang, K., "Laser Based Fabrication of Graphene", Intech, 77-95 (2013).
Wei, D., et al., "Laser direct synthesis of graphene on quartz", Carbon, 53 (2013) 374-379.
Baeri et al.: "Segregation Effects in Cu-Implanted Si after Laser-Pulse Melting;" Physical Review Letters, vol. 41, No. 18, Oct. 30, 1978; pp. 1246-1249.
Grantab et al.; "Anomalous Strength Characteristics of Tilt Grain Boundaries in Graphene;" Science, vol. 330 (6006), Nov. 12, 2010; pp. 946-948.
Wei et al.; "Laser direct growth of graphene on silicon substrate;" Applied Physics Letters 100, 023110; Jan. 10, 2012.
Fan, L. et al. "Laser direct writing graphene patterns on SiO2/Si substrates" Proc. SPIE 8608, Laser-based Micro- and Nanopackaging and Assembly VII, 86060J (Mar. 15, 2013).
Koh, A. T. T. et al. "Cooling rate and energy dependence of pulsed laser fabricated graphene on nickel at reduced temperature" App. Phys. Lett., vol. 97, No. 11, pp. 114102 (2010).
Suemitsu, M et al. "Epitaxial graphene on silicon substrates" J. Phys. D.: App. Phys., vol. 43, No. 37, 374012 (2010).
Wang, G. et al. "Direct Growth of Graphene Film on Germanium Substrate" Scientific Reports, vol. 3 : 2465 (2013).
Choi, I. et al. "Laser-Induced Solid-Phase Doped Graphene" ACS Nano 2014, vol. 8. No. 8, pp. 7671-7677.
Nie et al., "Origin of the Mosaicity in Graphene Grown on Cu(111)," Physical Review B 84, 155425 (2011).
International Preliminary Report on Patentability dated Aug. 9, 2016 for International Application No. PCT/SG2015/000029 entitled "Method of Pulsed Laser-Based Large Area Graphene Synthesis on Metallic and Crystalline Substrates".
International Search Report and Written Opinion of the International Searching Authority dated Apr. 16, 2015 for International Application No. PCT/SG2015/000029 entitled "Method of Pulsed Laser-Based Large Area Graphene Synthesis on Metallic and Crystalline Substrates".
Luntz et al., "Review Article: Dynamics of methane dissociation of transition metals," J. Vac. Sci. Technol. A, 35(5), Sep./Oct. 2017.
Huang et al., "Grains and grain boundaries in single-layer graphene atomic patchwork quilts," Nature, vol. 469, 2011.

(56) References Cited

OTHER PUBLICATIONS

Navid et al., "The effect of ultraviolet lasers on conversion of methane into higher hydrocarbons," Laser and Particle Beams, 31, 481-486, 2013.
Lee et al., "Laser-Synthesized Epitaxial Graphene", ACS Nano, vol. 4, No. 12, pp. 7524-7530, 2010.
Hwang et al., "Electrical characteristics of wrinkle-free graphene formed by laser graphitization of 4H-SiC", Applied Physics Letters 99, 082111, 2011.
Kim et al., "Modeling of the self-limited growth in catalytic chemical vapor deposition of graphene", New Journal of Physics, 15, 2013.
Bunch et al., "Impermeable Atomic Membranes from Graphene Sheets," Nano Letters, vol. 8, No. 8, pp. 2458-2462, 2008.
Schriver et al., "Graphene as a Long-Term Metal Oxidation Barrier: Worse Than Nothing", ACS Nano, vol. 7, No. 7, pp. 5763-5768, 2013.
Hao, et al., "The Role of Surface Oxygen in the Growth of Large Single-Crystal Graphene on Copper", Science, vol. 342, pp. 720-724, 2013.
Liu, et al., "Ultrathin high-temperature oxidation-resistant coating of hexagonal boron nitride", Nature Communications 4, 2541, published Oct. 4, 2013.

\* cited by examiner

METHOD OF PULSED LASER-BASED LARGE AREA GRAPHENE SYNTHESIS ON METALLIC AND CRYSTALLINE SUBSTRATES

RELATED APPLICATION(S)

This application is the U.S. National Stage of International Application No.: PCT/SG2015/000029, filed on Feb. 4, 2015 which designates the U.S., published in English, and claims the benefit of U.S. Provisional Application No. 61/935,535, filed on Feb. 4, 2014. This application also claims the benefit of U.S. Provisional Application No. 62/020,527, filed on Jul. 3, 2014. The entire teachings of the above applications are incorporated herein by reference.

BACKGROUND OF THE INVENTION

Large scale synthesis of graphene by copper-based chemical vapor deposition (CVD) methods is considered a potential route for graphene commercialization. Unfortunately, CVD graphene films consist of many small domains of graphene crystals that are stitched together. These resulting graphene has defective domain boundaries, and the average domain size remains in the 10-100 micrometer size range.

The properties of polycrystalline materials are often dominated by the atomic structure of their domain boundaries rather the single crystal domains themselves. Such polycrystalline graphene sheets are inferior to single domain graphene because grain boundaries can add resistance and random variation in uniformity. The multi-domain structure of polycrystalline graphene severely degrades its electrical and thermal conductivity as well as its mechanical and chemical properties. When such films are strained, grain boundaries increase the electrical resistance and make such films brittle and porous. These properties severely limit their potential for use in flexible touch panels and/or as gas barrier films (e.g., flexible gas barrier films).

Current CVD processes for manufacturing graphene are inadequate because they produce graphene with the deficiencies described above. For example, CVD techniques can yield random crystallization and growth of graphene. In other words, the graphene crystal size and location is uncontrolled. Additionally, CVD processes can be very slow (e.g., approximately 1 day for a 1 cm$^2$ crystal of graphene). Another challenge for CVD techniques is the integration of high throughput manufacturing techniques with the high temperature requirement of the CVD chamber. Typically, the entire CVD chamber is heated to a high temperature (up to approximately 1,000° C.). The flammable gas environment can damage the equipment if it comes into contact with air during sample loading or unloading, which leads to slow processing due to extensive environment control systems (high vacuum pumps etc.). Additionally, substrates need to be cooled slowly since non-uniform temperature drops over a large substrate can results in a warped substrate. Since cooling is faster at the edges of the substrate than the center, an environment having too large a temperature difference can yield non-uniform temperatures of the substrate. Therefore, the substrate cannot be immediately moved into a cool environment, which slows down the production rate and can be a limiting factor for commercial-scale production. Additionally, the substrate cannot be rolled upon itself or stacked upon itself within the growth system without damaging the graphene.

Accordingly, there is a need for improved processes for making graphene that is more crystalline and has more predictable crystalline boundaries, thereby enabling commercial scale production.

SUMMARY OF THE INVENTION

Disclosed herein is a method of making graphene. The method includes providing a seed gas in the presence of a metallic substrate, providing a pulsed, ultraviolet laser beam, and moving the substrate or the laser beam relative to the other, thereby advancing a graphene crystallization front and forming an ordered graphene structure. The laser beam can cause photodissociation of the seed gas. The laser beam can have a pulse duration of 10 nanoseconds to about 100 nanoseconds. Preferably, the laser beam can have a pulse duration of about 10 nanoseconds. The laser beam can be substantially parallel to the surface of the substrate and near the surface of the substrate, such as about 5 centimeters or less from the substrate. The laser beam can contact the substrate at an angle of about 30 degrees or less, preferably about 10 degrees or less. The seed gas can be methane or acetylene. The wavelength of the laser can be approximately 193 nm, 248 nm, or 308 nm. The metallic substrate can be nickel, copper, scandium, titanium, vanadium, manganese, iron, cobalt, ruthenium, platinum, germanium, silicon carbide, or a copper-nickel alloy. The substrate can have a two-fold symmetric atomic surface, such as a germanium [110] surface or a silicon [110] surface. The method can further include preparing the germanium [110] surface by contacting the germanium [110] surface with one or more of piranha solution ($H_2O_2$:$H_2SO_4$) and hydrofluoric acid. The substrate can have a silicon [110] surface. The method can further include annealing the ordered graphene structure with the laser.

Also disclosed herein is a method of recrystallizing graphene, which includes providing a pulsed, ultraviolet laser beam a polycrystalline graphene sheet and moving the substrate or the laser beam relative to the other, thereby causing the graphene to become more crystalline. The laser beam can have a pulse duration from about 10 nanoseconds to about 100 nanoseconds, preferably about 10 nanoseconds. The wavelength of the laser can be approximately 193 nm, 248 nm, or 308 nm.

Making graphene by using a pulsed laser provides advantages over other methods of making graphene. Since the energy of the photons of a laser beam is inversely proportional to the wavelength, decreasing the wavelength of the laser increases the energy in each photon. Therefore, a pulsed laser beam can provide sufficient energy to photodissociate the seed gas. Notably, since the laser is pulsed, the laser beam does not cause a significant increase in the temperature of the substrate. In contrast, other methods require heating the substrate to near its melting point (e.g., approximately 1,085° C. for copper). Such elevated temperatures significant impact the cost of making graphene by requiring the use of equipment that can withstand the elevated temperatures. Additional costs results from the additionally time required for the substrate to cool down to a suitable temperature at which it can be handled. After removal of the graphene from the substrate, the substrate can be reused without having to remove impurities.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Graphene is a two dimensional sheet of carbon that has highly desirable physical properties for use in tissue regeneration and medical devices. Graphene is the strongest material known having a Young's modulus of 0.5-1 TPa, yet it is extremely flexible and not brittle. Graphene can be transferred onto any flat or irregular shaped surface and graphene-coated, flexible, supporting substrates can be easily bent into any shape required. Being only one atom thick, yet fully continuous it also introduces the minimum amount of non-biodegradable material preventing inflammatory or other immune responses seen with other non-biologic materials. Graphene also serves as an impenetrable gas barrier and can hermetically seal the substrate or implant material, protecting it from any degradation due to external factors. As a result, graphene may significantly strengthen bone structures or eventual implants in addition to serving as a substrate for tissue regeneration and/or repair.

The graphene produced by the methods described herein can be annealed by using a laser or by simply heating the graphene under an atmosphere of hydrogen-argon ($H_2$—Ar) gas mixture. Annealing of the graphene can be used to enhance the quality of the graphene substrate by reducing irregularities at the intersection of adjacent graphene crystals. The same laser can be used to both pattern and anneal the graphene substrate. The laser power required for the annealing process is lower than that used for the patterning process.

A two-fold symmetric surface can be rotated by 180 degrees around the normal to the surface to result in the same crystal structure.

As used herein, approximately refers to values that are within 25% of the stated value. In other embodiments, approximately refers to values that are within 15% of the stated value. In other embodiments, approximately refers to values that are within 10% of the stated value. In other embodiments, approximately refers to values that are within 5% of the stated value. In other embodiments, approximately refers to values that are within 1% of the stated value.

Substrates on which graphene can be formed include, but are not limited to, nickel, copper, scandium, titanium, vanadium, manganese, iron, cobalt, ruthenium, platinum, germanium, silicon carbide (SiC), and copper-nickel alloys. Substrates can include also non-metal or non-oxide substrates, such as germanium and other semiconductor materials. The substrate can be freestanding, such as a foil or wafer, or it can be sputtered/coated on a supportive substrate (e.g., a supporting substrate that is conducting, insulating, an oxide, or crystalline wafer). Thus, a wide variety of substrates can be used, so long as the substrate can provide a catalytic surface for the conversion of carbon atoms into a graphene lattice. Further, the substrate may contain micro or nano-patterned metal catalyst such as single crystalline copper nanowires or dispersed nanoparticles.

Figure 1:
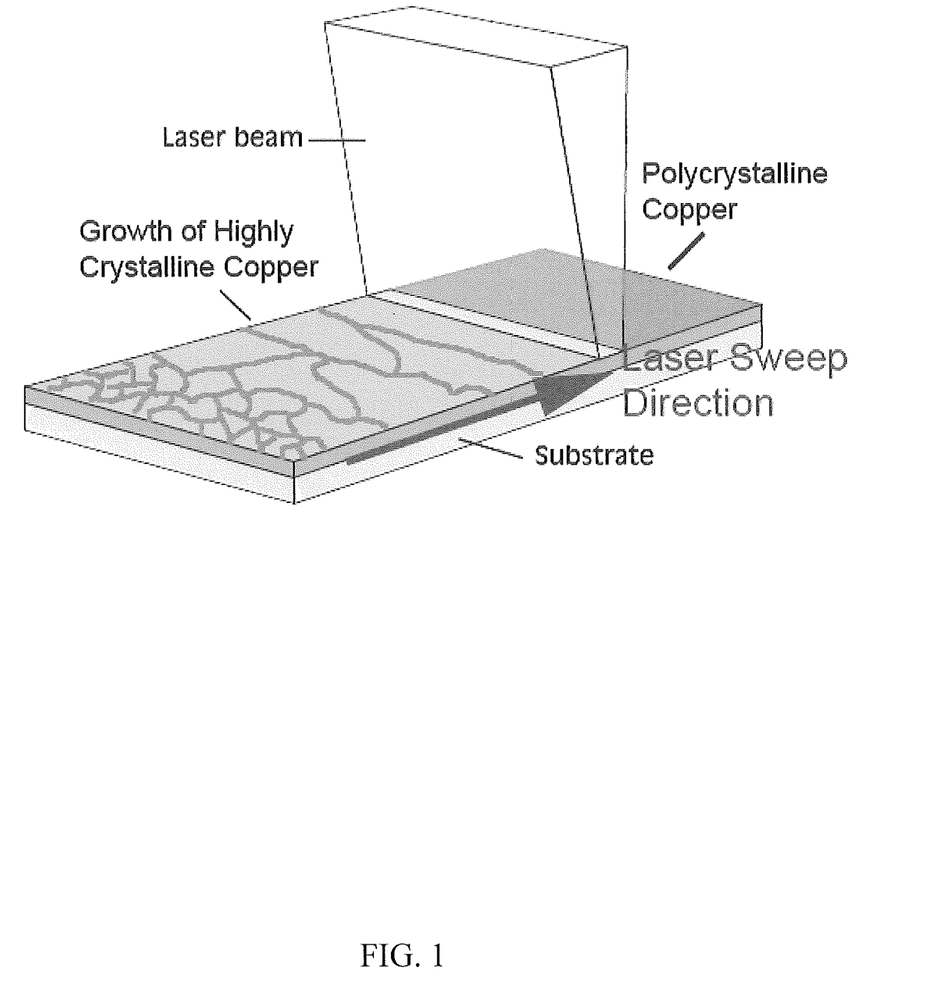
FIG. 1 is a schematic illustrating the process for crystallization of a metal substrate.

Preferably, the impurities within the substrate are removed prior to graphene growth. First, the substrate can be pre-cleaned and/or supplemented with a suitable plasma treatment. Second, impurities can be reduced and nucleation sites can be created by using a laser beam to cause local heating of the substrate. Increasing the fluence of the laser will increase the size of the laser spot, thereby increasing the extent of local melting of the substrate. Towards the boundaries of the spot where the laser beam contacts the substrate, the temperature decreases, which causes a diffusive migration of impurities (chemical impurities and/or crystalline imperfections) towards hotter regions of the substrate. For crystallization of large area substrate, the laser can be rastered at suitable speed across the substrate surface. The laser spot can be controlled such that the gradient of the fluence across the spot can be shaped for optimized melting/substrate crystallization process in combination with suitable rastering patterns. Crystallization of the substrate can be optimized by varying the pressure and chemical gaseous composition of the substrate environment during the substrate preparation process. FIG. 1 illustrates the use of a laser to prepare a substrate. The laser, beam is swept across a polycrystalline substrate, such as a polycrystalline copper substrate, which causes local melting and results in the growth of more crystalline copper.

Alternatively, nucleation sites can be created on a crystallized substrate with a fluence below the substrate crystallization and below the graphene ablation threshold. Nucleation sites can also be patterned in ways that are limited by the movement of the substrate and/or shape/size of the laser spot on the sample. Specifically striped patterns, dot arrays single nucleation sites or a combination thereof can be formed.

Graphene can be grown by pulsing a laser in the presence of a seed gas. The laser can be oriented in three distinct orientations.

In a first embodiment, the laser beam directly contacts the substrate to provide growth from selected nucleation sites. The laser spot is focused on the nucleation site in an environment that contains suitable concentration of carbon seed gas. The fluence of the laser spot is adjusted below the graphene ablation threshold. Graphene crystal growth is from the nucleation site radially outwards. Suitable rastering of the laser spot will guide the crystal growth across the substrate. Alternatively, suitable laser spot movement is conducted to stimulate the merging of small crystals from multiple nucleation sites. The system spontaneously collapses into a dominant crystal grain with increased grain size. In direct focusing mode, the laser is used as local heat source and photo dissociation source simultaneously.

In a second embodiment, the laser beam is oriented substantially parallel, and near to the substrate. The laser does not impinge on the substrate, and therefore this growth process is based on photo-assisted cracking of the seed gas in the vicinity of the laser beam and subsequent thermal chemical vapor deposition on the substrate. Graphene growth can be controlled by adjusting the concentration of the seed gas in the growth chamber, the fluence of the laser beam, the size and shape of the laser beam, and the distance between the laser beam from the substrate. The laser beam should be as close as possible to the substrate, typically about 5 centimeters or less.

In a third embodiment, which may be referred to as "glancing angle," the laser beam contacts the substrate at an angle of about 30 degrees or less, preferably 10 degrees or less.

The seed gas can be a carbon-containing gas. Common seed gases include, but are not limited to, methane, acetylene, light hydrocarbons, and gaseous alcohols.

For each of the three orientations of the laser beam, a pulsed laser is activated. Typically, the laser pulse has a duration of about 10 nanoseconds to about 100 nanoseconds. Without wishing to be bound by theory, the laser pulses cause photodissociation of the seed gas. Once the seed gas has photodissociated, carbon atoms of the seed gas form graphene crystals on the substrate.

After the graphene has been grown, the graphene is preferably recrystallized and/or multilayered graphene is ablated. A partially crystallized or fully amorphous carbon layer covers the substrate, which may be part of a stacked structure with other materials below the carbon layer. The carbon layer may be amorphous elemental carbon or a layer with thickness ranging from 10 nanometer to 10 micrometer of carbon based polymer material. The laser spot is focused on the substrate in vacuum condition and in the case of recrystallization the fluence is controlled below the graphene ablation threshold. Rastering of the laser spot over the substrate results in local heating of the carbon and therefore recrystallization of the carbon film. Alternatively, increase of fluence above the ablation threshold will result in selective ablation and/or local recrystallization of carbon to crystalline carbon. Time controlled application of suitable laser fluence will result in selective removal of carbon ultimately resulting in atomically thin layers. The angle of the laser beam can be applied perpendicular to the substrate surface, at a glancing angle, or at any other angle. The laser beam can impart energy to break the bonds of the graphene to cause recrystallization of graphene. Generally, by increasing the duration for which the graphene is exposed to the laser, the quality of the graphene improves as it becomes less polycrystalline.

Figure 5A:
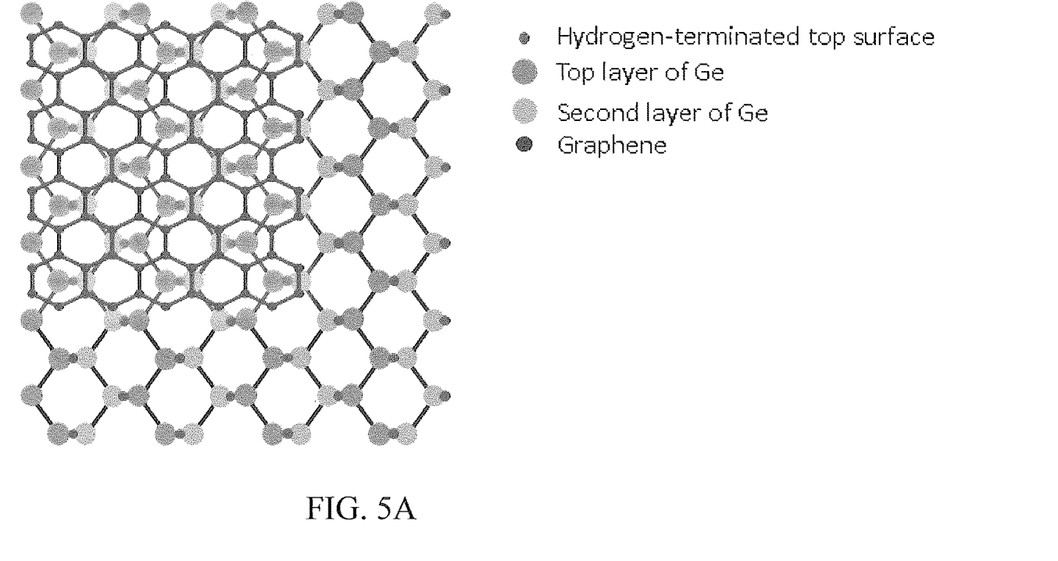
FIG. 5A is a schematic illustrating graphene growth on a two-fold symmetric Ge [110] surface.
Figure 5B:
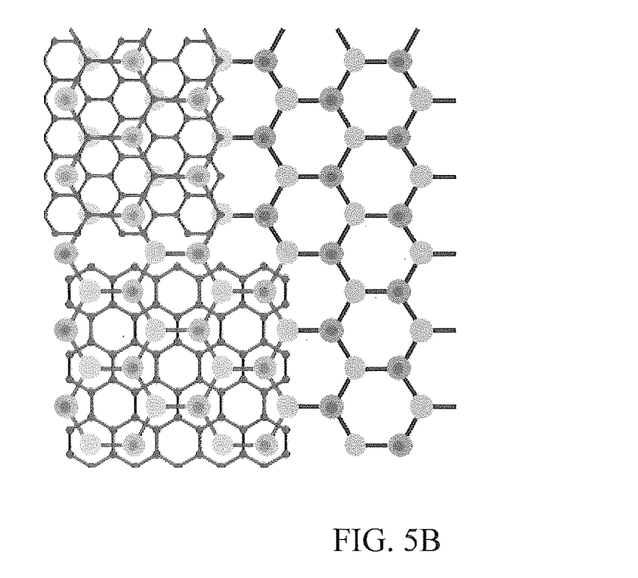
FIG. 5B is a schematic illustrating graphene growth on a three-fold symmetric Ge [111] surface.

In another embodiment, illustrated schematically in FIG. 5A, graphene can be grown on a substrate having a two-fold symmetric atomic surface. In particular, FIG. 5A shows graphene growth on a two-fold symmetric Ge [110] surface. A two-fold symmetric surface can be rotate by 180 degrees around the normal to the surface to result in the same crystal structure. For comparison, a three-fold symmetric Ge [111] surface is shown in FIG. 5B, which results in the same crystal structure when rotated by 120 degrees (e.g., 360 degrees divided by 3) around the normal. The crystal faces of FIGS. 5A and 5B results in distinctly different graphene growths mechanisms. The nucleation of a graphene crystal is followed by outwards growth from the nucleation site. The large scale graphene crystal will adapt the orientation of the nucleation site. The graphene crystal will grow on the macroscopic scale across different grain boundaries and crystal orientations of the catalytic substrate, but it will adhere to the crystal orientation of the nucleation site. In case of a twofold symmetric substrate, graphene will grow only in one kind of crystal orientation. Every single nucleation site has the same crystal orientation and therefore, when two graphene crystals meet and join during the growth of the substrate covering film, the boundaries will have equal crystal orientation and will therefore match seamlessly, as depicted in FIG. 5A. On the other hand, on substrates with higher order symmetry such as depicted in FIG. 5B, two graphene crystals with different crystal orientations will not be able to join seamlessly and therefore will introduce grain boundaries in the graphene film. These grain boundaries are the source for essentially all deficiencies associated with low quality graphene.

Growth on Polycrystalline Metallic Substrates

Large area high crystalline quality graphene can be synthesized on two distinct types of substrates. The first kind of substrate is polycrystalline, metallic substrates. Such a substrate utilizes a pulsed laser as a source for selective nucleation, heat and photo dissociation of seed gas or a combination thereof. A person skilled in the art will appreciate that there are various combinations of the following processes to achieve the highest possible graphene quality. First, the substrate is prepared by removing impurities and crystallization through laser induced melting under vacuum or in a hydrogen environment. Second, nucleation sites are induced at selected areas of the substrate with the pulsed laser. Third, graphene is grown on a catalytic substrate through locally controlling the temperature of the latter by controlling the fluence of the laser. Fourth, graphene is grown on a substrate through photo-dissociative processes by utilizing glancing angle incidence beam path, which is the angle between a ray incident on a plane surface and the surface. Typically, the angle is less than 30 degrees, and therefore is a glancing angle. Fifth, graphene is grown utilizing a combination of step three and four. In other words, the glancing angle is selected so that an optimal amount of local heating is obtained on the substrate in order to balance optimal graphene growth and minimal laser damage to the graphene. Sixth, graphene is recrystallized through annealing the sample with the laser. Seventh, graphene is patterned utilizing ablation processes.

Substrates on which graphene can be formed include, but are not limited to, nickel, copper, scandium, titanium, vanadium, manganese, iron, cobalt, ruthenium, platinum, germanium, silicon carbide (SiC), and copper-nickel alloys. Substrates can include also non-metal or non-oxide substrates, such as germanium and other semiconductor materials. The substrate can be freestanding, such as a foil or wafer, or it can be sputtered/coated on a supportive substrate (e.g., a supporting substrate that is conducting, insulating, an oxide, or crystalline wafer). Thus, a wide variety of substrates can be used, so long as the substrate can be treated with the laser to become more crystalline and provide a catalytic surface for the conversion of carbon atoms into a graphene lattice.

Substrate Preparation: Laser Purification and Float-Zone Crystal Growth of Catalytic Substrate Float zone crystal growth of catalytic metal substrate is initiated due to the establishment of a large temperature gradient at the boundaries of the laser spot. At the center of the laser spot, the fluence is controlled such that the substrate will locally melt. Towards the boundaries of the laser spot, the temperature will drastically decrease which leads to a diffusive migration of impurities (chemical impurities and/or crystalline imperfections) towards hotter regions of the substrate. A person skilled in the art will appreciate the possibility to pre-clean and/or supplement the substrate preparation with a suitable plasma treatment. For crystallization of large area substrate, the laser is rastered at suitable speed across the substrate surface. A person skilled in the art will appreciate that the laser spot can be controlled such that the gradient of the fluence across the spot can be shaped for optimized melting/substrate crystallization process in combination with suitable rastering patterns. A person skilled in the art will appreciate that by varying the pressure and chemical gaseous composition of the substrate environment during the substrate preparation process, crystallization of the substrate can be optimized.

Laser Assisted Nucleation

Nucleation sites are created by selective crystallization of the metal substrate in a condition where carbon seed gas with suitable pressure/concentration is present in the substrate environment. For this, local heating of the substrate through controlling the laser fluence is utilized. Alternatively, nucleation sites can be created on a crystallized substrate with a fluence below the substrate crystallization and below the graphene ablation threshold. The substrate material can be copper, nickel or copper-nickel alloy, or any other substrate that has been identified as a catalyst for graphene growth. Further, the substrate may contain micro or nano-patterned metal catalyst such as single crystalline copper nanowires or dispersed nanoparticles.

Nucleation sites can be patterned in ways that are limited by the movement of the substrate and/or shape/size of the laser spot on the sample. Specifically striped patterns, dot arrays single nucleation sites or a combination thereof can be formed. The patterning of the nucleation sites is specific to the following graphene growth process step and the person skilled in the art will appreciate the need for optimizing the generation of nucleation sites for the respective graphene crystal growth.

Graphene Growth Methods

We disclose three distinct graphene crystal growth methods. The person skilled in the art will determine the suitable combination of both growth methods for optimized results. The person skilled in the art will appreciate that either growth method may be supplemented by external heating of the substrate and/or plasma assisted growth.

1. Direct focusing of laser on substrate: growth from selected nucleation sites. Graphene crystal growth similar to copper crystallization growth. The laser spot is focused on the nucleation site in an environment that contains suitable concentration of carbon seed gas. The fluence of the laser spot is adjusted below the graphene ablation threshold. Graphene crystal growth is from the nucleation site radially outwards. Suitable rastering of the laser spot will guide the crystal growth across the substrate. Alternatively, suitable laser spot movement is conducted to stimulate the merging of small crystals from multiple nucleation sites. The system spontaneously collapses into a dominant crystal grain with increased grain size. In direct focusing mode, the laser is used as local heat source and photo dissociation source simultaneously.

2. Indirect laser assisted growth: laser beam is guided in parallel to the catalyst substrate. Laser does not impinge on the substrate and therefore this growth process is based on photo-assisted cracking of the seed gas in the vicinity of the laser beam and subsequent thermal chemical vapor deposition on the substrate. The person skilled in the art will appreciate that the concentration of seed gas in the growth chamber, the fluence, size and shape of the laser beam as well as the distance of the laser beam from the substrate controls the graphene crystal growth. These parameters need to be optimized for optimal results for the particular growth. The laser fluence increases the amount of photo-dissociation and increase the amount of carbon on the substrate available for graphene growth. Similarly, the size, shape and distance of the laser beam from the substrate affects the distribution of carbon on the substrate, and therefore affects graphene growth. These parameters can be optimized to grow monolayer crystalline graphene at the fastest speed.

3. Graphene growth through combination of growth method disclosed under 1. and 2. above. A combination and/or sequence of the direct and indirect growth is utilized to achieve improvement of graphene crystallinity, layer composition, film homogeneity and growth speed.

4. Recrystallization of Amorphous Carbon

Crystallinity of graphene is controlled by recrystallization of amorphous carbon and/or ablation of multilayer graphene. A partially crystallized or fully amorphous carbon layer covers the substrate. This carbon layer may be part of a stacked structure with other materials below the carbon layer. The carbon layer may be amorphous elemental carbon or a layer with thickness ranging from 0.1 nanometer to 1 micrometer of carbon based polymer material. The laser spot is focused on the substrate in vacuum condition and in the case of recrystallization the fluence is controlled below the graphene ablation threshold. Rastering of the laser spot over the substrate results in local heating of the carbon and therefore recrystallization of the carbon film. Alternatively increase of fluence above the ablation threshold will result in selective ablation and/or local recrystallization of carbon to crystalline carbon. Time controlled application of suitable laser fluence will result in selective removal of carbon ultimately resulting in atomically thin layers.

Growth on the [110] Surface of H-Terminated Germanium and Silicon

The second kind of substrate in this invention disclosure relates to the rapid growth of single crystalline graphene on the [110] surface of H-terminated germanium and silicon, but the concept disclosed here can be extended to any two-fold symmetric surface with appropriate conditions that enable epitaxial growth such as lattice constant, surface smoothness, surface chemistry, carbon solubility amongst others. Appropriate conditions for the lattice constant are such that the lattice constant of the substrate is either similar or multiple times the lattice constant of graphene. The surface of the substrate should be atomically smooth. The surface of the substrate is hydrogen-terminated. The carbon solubility of the substrate should be small to negligible.

Substrate Preparation: Hydrogen Termination of a Germanium [110] Surface

We disclose the preparation of a germanium [110] surface as the first step in our growth process. In principle, every [110] surface resembling that of an elemental face-centered cubic crystal is suitable for the growth process described in this invention disclosure (such as silicon). The person skilled in the art will appreciate a suitable process to terminate the surface with hydrogen. Such processes include wet etching steps with piranha solution ($H_2O_2:H_2SO_4$) and hydrofluoric acid (HF) solutions in appropriate concentration and process parameters or treatment of the surface with hydrogen plasma. Without wishing to be bound by theory, piranha solution removes organics and terminates the surface with hydrogen while hydrofluoric acid removes oxides and terminate the surface with hydrogen. Surfaces can be treated with one or more of piranha solution and hydrofluoric acid.

Nucleation of Graphene Growth

Nucleation sites for graphene growth are created either through the substrate preparation process step or through selective substrate heating/dissociation through controlling the laser fluence. This is done in vacuum or inert gas environment. Nucleation sites can be patterned with the laser in ways that are limited by the movement of the substrate and/or shape/size of the laser spot on the sample. Specifically striped patterns, dot arrays single nucleation sites or a combination thereof. The patterning of the nucleation sites is specific to the following graphene growth and transfer process step and the person skilled in the art will appreciate the need for optimizing the generation of nucleation sites for the respective graphene crystal growth.

Graphene Growth Methods

We disclose two distinct graphene crystal growth methods. The person skilled in the art will determine the suitable combination of both growth methods for optimized results. The person skilled in the art will appreciate that either growth method may be supplemented by heating of the substrate and/or plasma assisted growth.

1. Direct focusing of laser on substrate (see FIG. 2): growth from selected nucleation sites. Graphene crystal growth similar to copper crystallization growth. The laser spot is focused on the nucleation site in an environment that contains suitable concentration of carbon seed gas. The fluence of the laser spot is adjusted below the graphene ablation threshold. Graphene crystal growth is from the nucleation site radially outwards. Suitable rastering of the laser spot will guide the crystal growth across the substrate. Alternatively, suitable laser spot movement is conducted to stimulate the merging of small crystals from multiple nucleation sites. In direct focusing mode, laser is used as local heat source and photo dissociation source simultaneously.

Figure 2:
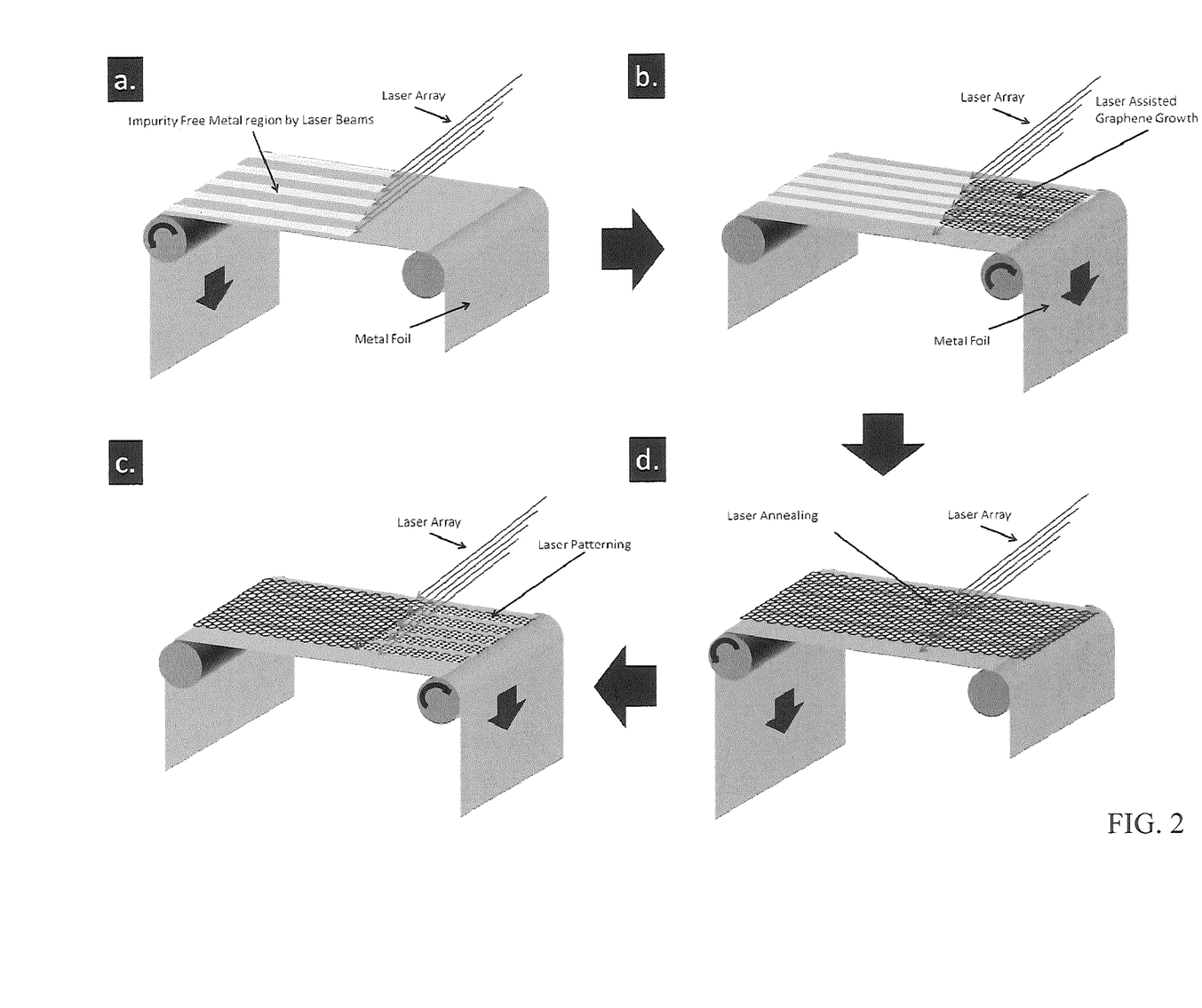
FIG. 2A is a schematic illustrating laser irradiation of a substrate.
FIG. 2B is a schematic illustrating the use of a laser to grow graphene.
FIG. 2C is a schematic illustrating the use of a laser to pattern graphene.
FIG. 2D is a schematic illustrating the use of a laser to anneal graphene.

A person skilled in the art will also appreciate the possibility for direct patterning of graphene films on the surface through suitable laser focal spot size and/or movement of the substrate with respect to the laser spot. The smallest feature size of the patterned graphene film will be determined by the laser focal spot size and shape.

Figure 3:
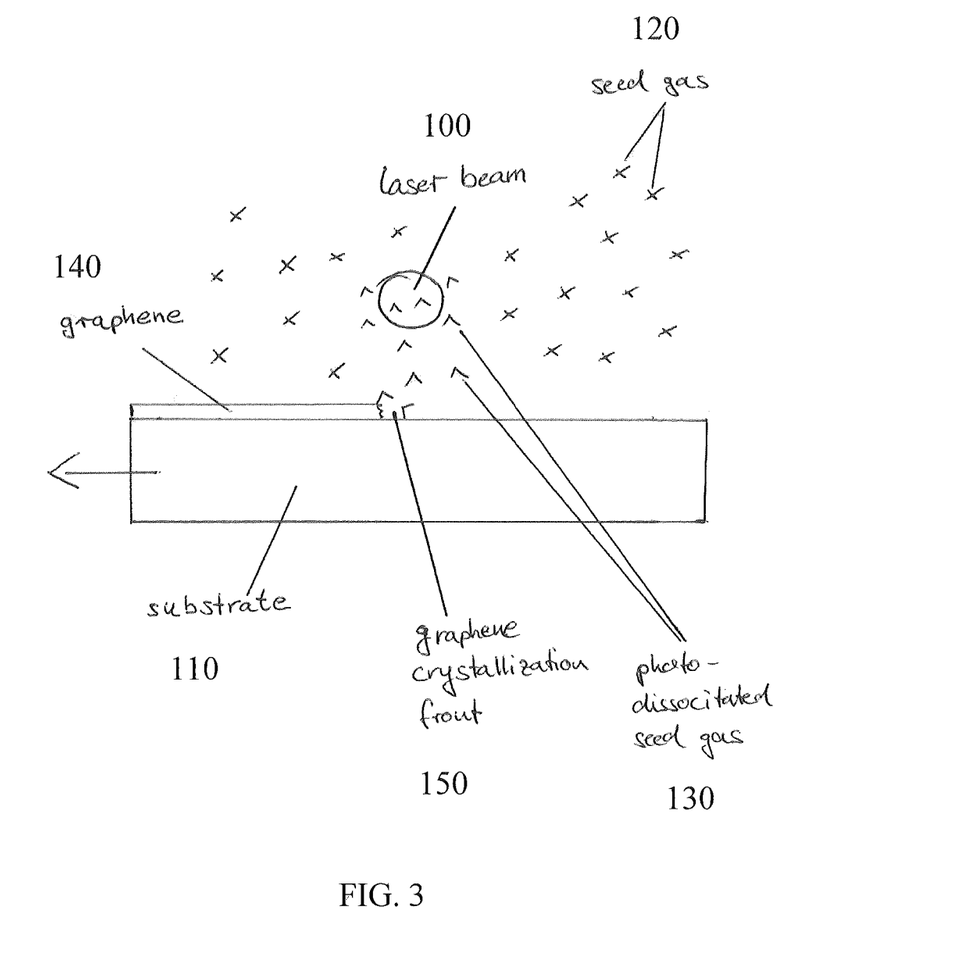
FIG. 3 is schematic illustrating a laser beam that is substantially parallel to a surface of a substrate.
Figure 4:
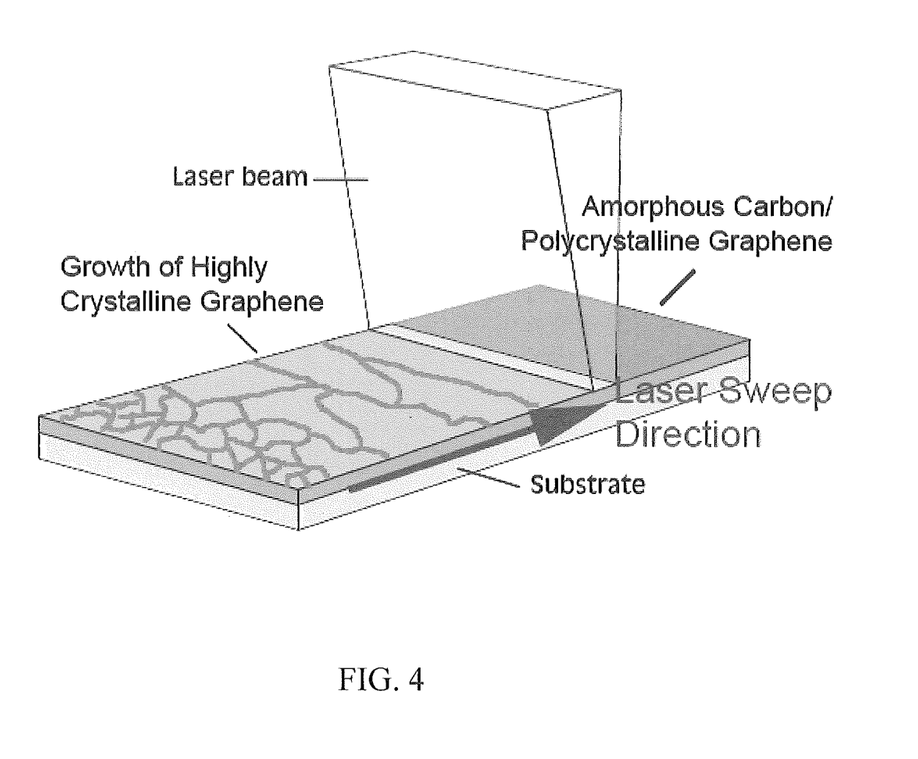
FIG. 4 is schematic illustrating the use of a perpendicular laser beam to anneal the graphene such that the grain size grows from small polycrystalline to large crystal graphene.

2. Indirect laser assisted growth (see FIG. 3): laser beam is guided in parallel to the catalyst substrate. Laser does not impinge on the substrate and therefore this growth process is based on photo-assisted cracking of the seed gas in the vicinity of the laser beam and subsequent thermal chemical vapor deposition on the substrate. The person skilled in the art will appreciate that the concentration of seed gas in the growth chamber, the fluence, size and shape of the laser beam as well as the distance of the laser beam from the substrate controls the graphene crystal growth. These parameters need to be optimized for optimal results for the particular growth and a combination of parameters and effects might result in unforeseen effects. As illustrated in FIG. 3, a laser beam 100 is oriented substantially parallel to a substrate 110 in the presence of a seed gas 120. Each pulse of the laser beam 100 can yield photodissociated seed gas 130, which deposits on the substrate 110 to form graphene 140. As the laser beam 100 or substrate 110 is moved relative to the other, a graphene crystallization front 150 forms and advances.

3. Graphene growth through combination of growth method disclosed under 1. and 2. above. A combination and/or sequence of the direct and indirect growth is utilized to achieve improvement of graphene crystallinity, layer composition, film homogeneity and growth speed.

4. Recrystallization of amorphous carbon. Crystallinity of graphene is controlled by recrystallization of amorphous carbon and/or ablation of multilayer graphene. A partially crystallized or fully amorphous carbon layer covers the substrate, which may be part of a stacked structure with other materials below the carbon layer. The carbon layer may be amorphous elemental carbon or a layer with thickness ranging from 10 nanometer to 10 micrometer of carbon based polymer material. The laser spot is focused on the substrate in vacuum condition and in the case of recrystallization the fluence is controlled below the graphene ablation threshold. Rastering of the laser spot over the substrate results in local heating of the carbon and therefore recrystallization of the carbon film. Alternatively, increase of fluence above the ablation threshold will result in selective ablation and/or local recrystallization of carbon to crystalline carbon. Time controlled application of suitable laser fluence will result in selective removal of carbon ultimately resulting in atomically thin layers.

FIG. 5 schematically describes the main points of advantage for the growth on this particular surface as compared to a surface with higher order symmetry. FIG. 5A shows the two-fold symmetric Ge [110] surface of an elemental crystal. Two-fold symmetric means that one can only rotate the structure by 180 degrees around the normal to the surface to get the same crystal structure as before. A three-fold symmetric Ge [111] surface is shown in FIG. 5B. One can rotate the system by 120 degrees=360 deg./3 around the normal to get the same crystal orientation again. This results in distinctly different graphene growth mechanisms, shown in FIG. 5A and FIG. 5C. The nucleation of a graphene crystal is followed by outwards growth from the nucleation site. The large scale graphene crystal will adapt the orientation of the nucleation site. The graphene crystal will grow on the macroscopic scale across different grain boundaries and crystal orientations of the catalytic substrate, but it will adhere to the crystal orientation of the nucleation site. In case of a two-fold symmetric substrate, graphene will grow only in one kind of crystal orientation. Every single nucleation site has the same crystal orientation and therefore, when two graphene crystals meet and join during the growth of the substrate covering film, the boundaries will have equal crystal orientation and will therefore match seamlessly. This is depicted in FIG. 5A. On the other hand, on substrates with higher order symmetry such as depicted in FIG. 5B, two graphene crystals with different crystal orientations will not be able to join seamlessly and therefore will introduce grain boundaries in the graphene film. These grain boundaries are the source for essentially all deficiencies associated with low quality graphene.

INCORPORATION BY REFERENCE AND EQUIVALENTS

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A method of making graphene, comprising:
   providing a seed gas in the presence of a metallic substrate having a surface;
   irradiating the substrate with a pulsed, ultraviolet laser beam at an angle of about 30 degrees or less to photodissociate the seed gas so that carbon atoms of the photodissociated seed gas form graphene crystals on the substrate; and moving the substrate or the ultraviolet laser beam relative to the other, thereby advancing a graphene crystallization front and forming an ordered graphene structure.

2. The method of claim 1, wherein the ultraviolet laser beam has a pulse duration of about 10 nanoseconds.

3. The method of claim 1, wherein the seed gas is methane or acetylene.

4. The method of claim 1, wherein the wavelength of the ultraviolet laser beam is approximately 193 nm, 248 nm, or 308 nm.

5. The method of claim 1, wherein the metallic substrate is nickel, copper, scandium, titanium, vanadium, manganese, iron, cobalt, ruthenium, platinum, germanium, silicon carbide, silicon, or a copper-nickel alloy.

6. The method of claim 5, wherein the substrate has a two-fold symmetric atomic surface.

7. The method of claim 6, wherein the substrate has a germanium [110] surface.

8. The method of claim 7, further comprising preparing the germanium [110] surface by contacting the germanium [110] surface with one or more of piranha solution ($H_2O_2$: $H_2SO_4$) and hydrofluoric acid.

9. The method of claim 6, wherein the substrate has a silicon [110] surface.

10. The method of claim 1, further comprising annealing the ordered graphene structure with the laser.

* * * * *